United States Patent [19]

Hemmerdinger et al.

[11] Patent Number: 4,925,636
[45] Date of Patent: May 15, 1990

[54] APPARATUS FOR DIRECTIONAL SOLIDIFICATION OF A CRYSTAL MATERIAL

[75] Inventors: Louis H. Hemmerdinger, Old Bethpage, N.Y.; Gregory W. Knowles, Lexington, Va.; George B. Patterson, Bellport, N.Y.

[73] Assignee: Grumman Aerospace Corporation, Bethpage, N.Y.

[21] Appl. No.: 132,224

[22] Filed: Dec. 14, 1987

[51] Int. Cl.⁵ .............................. C30B 13/16
[52] U.S. Cl. .................... 422/248; 422/254; 156/616.1; 156/620.7; 156/DIG. 62
[58] Field of Search ............... 422/248, 254; 156/DIG. 62, 616.1, 620.7

[56] References Cited

U.S. PATENT DOCUMENTS

| | | | |
|---|---|---|---|
| 2,789,039 | 4/1957 | Jensen | 156/619 |
| 2,902,350 | 9/1959 | Jenny et al. | 156/619 |
| 2,990,257 | 6/1961 | Heneage et al. | 156/619 |
| 3,198,929 | 8/1965 | Stut | 373/139 |
| 3,260,573 | 7/1966 | Ziegler | 156/619 |
| 3,630,684 | 12/1971 | Keller | 156/619 |
| 3,897,815 | 8/1975 | Smashey | 164/122.1 |
| 3,984,280 | 10/1976 | Besselere et al. | 156/617 |
| 4,086,424 | 4/1978 | Mellen, Sr. | 156/617 |
| 4,178,986 | 12/1979 | Smashey | 164/122.1 |
| 4,314,128 | 2/1982 | Chitre | 156/617 |
| 4,483,736 | 11/1984 | Orito | 156/616 |
| 4,544,025 | 10/1985 | Aldrich | 165/65 |
| 4,797,174 | 1/1989 | Comera et al. | 422/254 |

Primary Examiner—Melvyn J. Andrews
Attorney, Agent, or Firm—Pollock, VandeSande & Priddy

[57] ABSTRACT

A furnace for growing a semiconductor crystal includes an elongated tubular chamber encased within a cylindrical jacket. The furnace is divided into a plurality of zones with each zone having a corresponding insulation block for preventing heat loss from the chamber and to absorb external vibrations. The chamber is heated by sets of heater elements fixed thereto. Each set of heater elements is controlled by a corresponding processing means which supplies needed power thereto for generating the desired temperature in that zone. To draw heat from a particular area, an annular shunt disc may be interposed concentrically between the chamber and the jacket for providing a radial path for heat to flow from the chamber to the environment through the jacket. Because of its sound construction and the requirement of only minimal power, this furnace is particularly well adapted to operate on Earth, and in a micro-gravity environment and withstand launches to and from space.

12 Claims, 3 Drawing Sheets

APPARATUS FOR DIRECTIONAL SOLIDIFICATION OF A CRYSTAL MATERIAL

FIELD OF THE INVENTION

The present invention is directed to a furnace for processing semiconductor crystals and more particularly to a furnace which utilizes minimum amounts of power and has a temperature gradient for directional solidification of the semiconductor crystals. The present invention further pertains to a method for directionally solidifying a semiconductor crystal in the present invention furnace. Both the furnace and method may be used on Earth and in the micro-gravity environment of space.

BACKGROUND OF THE INVENTION

It is assumed that because of the micro-gravity environment in space, a relatively blemish free semiconductor crystal can be more effectively fabricated therein. To fabricate a semiconductor crystal on Earth, the conventional method involves the use of Bridgman-Stockbarger type furnaces which provide for passing a polycrystalline mixture, for example, Gallium Arsenide (GaAs), in an ingot from a high temperature zone to a lower temperature zone. These Bridgman-Stockbarger directional solidification systems use the heating elements in the respective zones for regulating the temperatures therein. To obtain the desired gradients within the furnace, these furnaces are thinly insulated, the heat generated by the heating elements escaping readily into the environment. Accordingly, since it is the respective heating elements which regulate the amount of heat for the different zones of the furnace, a large amount of power, exceeding that which may be technologically and economically generated in space, is needed.

Therefore, to fabricate substantially perfect semiconductor crystals in space, it is imperative that a low power furnace capable of achieving the same end result as a Bridgman-Stockbarger type furnace be used. Furthermore, since this furnace has to be launched into space, it has to be structurally sound.

Accordingly, it is an object of the present invention to provide a low power furnace which is capable of creating precise temperature gradients in space for performing directional solidification of semiconductor crystals.

It is another object of the present invention to provide for a structurally sound furnace which is capable of withstanding the rigor of being launched into space.

A third object of the present invention is to minimize the length of the furnace thereby minimizing weight and volume for launch and operation in space.

BRIEF DESCRIPTION OF THE PRESENT INVENTION

The present invention (directional solidification furnace) has a cylindrical muffle or chamber into which an ampoule, which contains the seed and requisite materials for forming semiconductor crystals, may be placed. The muffle provides the desired temperature profile onto the ampoule and material to melt and solidify the material in a prescribed fashion. The muffle moves in an axial direction relative to the ampoule. The muffle is provided with electrically heated wire windings and is located within a concentric jacket that has a number of cooling tubes connected to the surface thereof. Liquid coolant flows through the cooling tubes for absorbing heat from the jacket. The jacket forms the housing for the furnace, which is divided into a number of zones. Multiple sets of heating elements, arranged such that each element serves one zone, are wound around the muffle. Each set of heating elements is controlled by a corresponding microprocessor which, together with requisite temperature sensors and electronics, controls the heating of the muffle at that particular zone.

To minimize escape of heat from the muffle, the area between the muffle and the jacket is completely filled with an insulating material tightly pressed against the muffle, thereby firmly holding the muffle in place. The insulating material acts to prevent heat from escaping from the muffle and to absorb vibrations which otherwise would rattle the muffle. Since the muffle is well insulated, only small amounts of heat leak from the muffle to the liquid-cooled jacket. Consequently, only a small amount of power is needed to heat the furnace.

To create a precise temperature gradient over a given length so that the molten semiconductor material can solidify therein, the present invention furnace has, placed between the jacket and muffle, annular shunt discs, at selected zones. The shunt disc is made up of thermal-conductive material and is riveted, welded or otherwise joined to the inner surface of the jacket in a manner providing good thermal contact. Since the shunt disc concentrically surrounds the muffle, it provides a radial path for the heat in the selected zone to flow from the muffle to the jacket, thereby cooling and effecting solidification of the melted material, starting at that zone. Additional temperature gradients over a short axial distance may be effected elsewhere in the furnace by interposing additional shunt discs between the jacket and the muffle at different zones. These additional temperature gradients may be needed to preserve the composition of the semiconductor crystal.

The above-mentioned objects and advantages of the present invention will become more apparent and the invention itself will be best understood by reference to the following description of an embodiment of the invention taken in conjunction with the accompanying drawings, wherein:

DETAILED DESCRIPTION OF THE PRESENT INVENTION

Figure 1A:
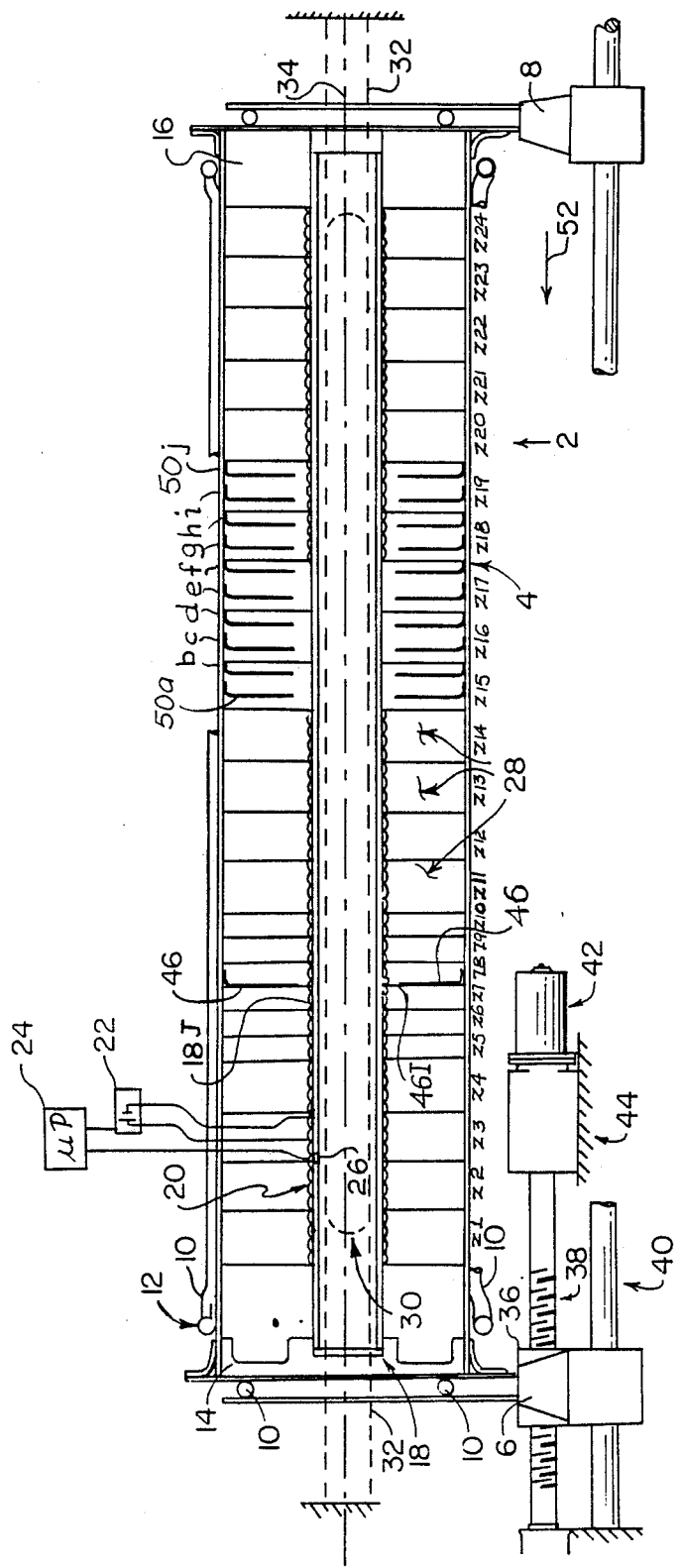
FIG. 1A is a cross-sectional view of the present invention furnace.

FIG. 1A illustrates a present invention furnace 2 having an elongated cylindrical furnace jacket 4. Furnace 2 is mounted on, for this embodiment, supports 6 and 8. Fixed to furnace jacket 4 is a number of coolant tubes 10 for carrying a cooling medium across the length of the furnace. A set of coolant manifolds 12 in turn connect coolant tubes 10 to a pump, which is not shown, for circulating the coolant medium.

Furnace 2 has a forward vestibule 14 and an aft vestibule 16. Journalled concentrically through 14 and 16 and located axially along the longitudinal axis of furnace 2 is a tubular chamber, otherwise designated as a muffle 18, which, for this embodiment is made from alumina. Multiple sets of heating elements 20, except in certain zones, are wound around muffle 18. For this embodiment, it can be seen that furnace 2 is divided into 24 zones. And but for zones Z15, Z16, Z17 and the vestibule portions, muffle 18 is completely encircled by sets of heater elements 20. The lack of heater elements for zones Z15, Z16 and Z17 will be discussed later on in the specification.

The heater elements are resistance heating coils and each set of heater elements is powered by a voltage source 22, shown connected only to the heater elements of zone Z3 for the sake of simplicity. Further connected to voltage source 22 is a microprocessor 24, which also has as a second connection to thermocouple 26 for measuring the temperature within muffle 18 for that particular zone. The microprocessor and the thermocouple are conventional. It must be noted that for each zone, which has a set of heater elements connected thereto, there is a similarly configured set of corresponding microprocessor and thermocouple.

Interposing concentrically between furnace jacket 4 and muffle 18 are a plurality of insulation element blocks 28, each block corresponding to a particular zone. In a different embodiment, it should be appreciated that instead of individual insulation blocks, other types of insulation material may be used to completely surround muffle 18. For this embodiment, insulation blocks 28 are made from conventional furnace insulation material chosen to substantially reduce the leaking of heat from muffle 18 to the environment. Only a minimal amount of power is required to heat up and maintain the furnace at a desired temperature.

An ampoule 30 is shown as movably fitted within muffle 18. It should be noted that ampoule 30 is supported by a pair of ampoule supports 32 and thus, although completely enclosed within muffle 18, does not actually come into contact therewith. Ampoule 30 is movable relative to furnace 2, as the latter is moved longitudinally along axis 34 by means of a ball nut 36 moving lengthwise along a ball screw 38 and guided by a guide rod 40. Ball screw 38 is activated by a motor 42 through a set of thrust bearings and reduction gears 44.

Figure 2:
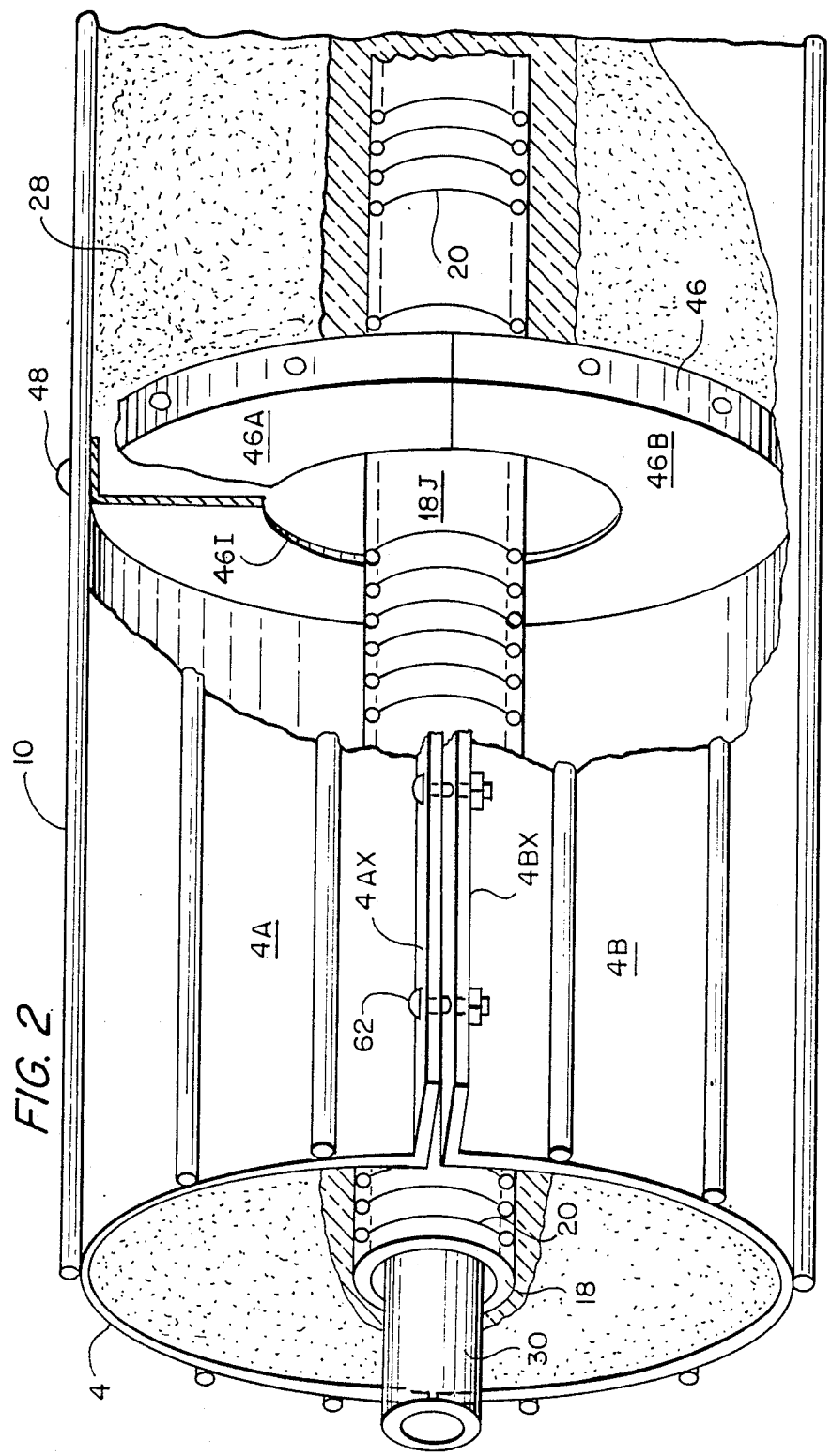
FIG. 2 is a perspective and semi-exposed view of a portion of the present invention furnace.

To facilitate the removal of heat at a certain zone, thereby creating a temperature gradient, while minimizing the use of power in other areas of the furnace, an annular shunt disc 46, made from a thermally-conductive material such as copper, is interposed concentrically between muffle 18 and furnace jacket 4. As best shown in FIG. 2, shunt disc 46 is secured to and contacts radially the inner surface of furnace jacket 4, by means of either rivets 48, bolts, spot welding, or the like. For ease of assembly, annular shunt disc 46 may be made from at least 2 separate portions 46A and 46B. Since shunt disc 46 is coupled to furnace jacket 4, which is also made from a thermal-conductive material such as aluminum or steel, any heat received by shunt disc 46 would be transferred to furnace jacket 4, which temperature may be regulated by the cooling medium circulating through the plurality of coolant tubes 10 connected thereto.

As shown in FIGS. 1A and 2, shunt disc 46 has an interior circumference 46I, which does not come into contact with outer circumference 18J of muffle 18. The distance between 18J and 46I can vary, depending on the solidification temperature gradient needed for a particular type of semiconductor crystal. In fact, empirically, it can be shown that as the distance between 18J and 46I shortens, more heat would be conducted away from that portion of muffle 18, thereby effecting a steeper slope for the corresponding temperature gradient. Conversely, were the distance between 18J and 46I increased, the slope of the particular temperature gradient would decrease. It should be noted that shunt disc 46, as shown in FIG. 2, has exaggerated dimensions, as an actual shunt disc is thinner than that shown.

Aside from shunt disc 46, additional shunt discs 50a to 50j are shown in FIG. 1A interposed between furnace jacket 4 and muffle 18 in zones Z15 to Z19. The rationale for these shunt discs will be explained presently.

Figure 1B:
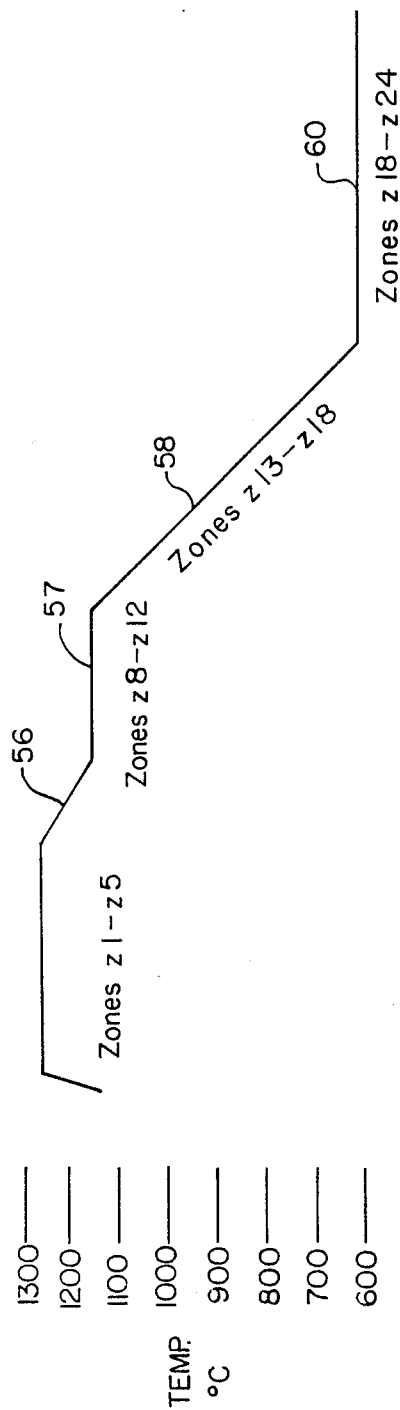
FIG. 1B is a temperature diagram showing the temperature along the length of the FIG. 1A furnace.
Figure 1C:
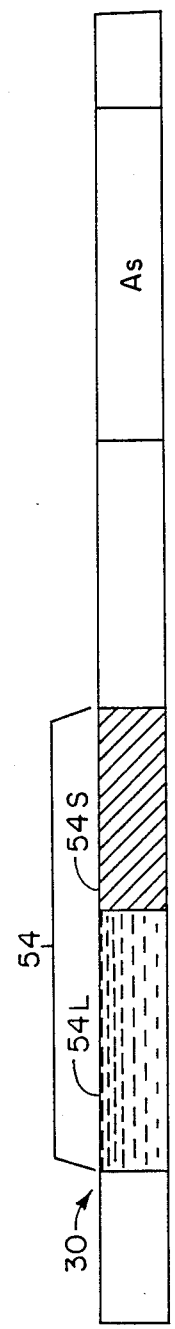
FIG. 1C is a representation of an ampoule and the contents therein when viewed in conjunction with the temperature graph of FIG. 1B.

Referring now to FIG. 1C, there is shown a simplified block diagram of ampoule 30, which is described in copending application Ser. No. 846,682 now U.S. Pat. No. 4,704,258 having as one of its inventors a co-inventor of the present invention and assigned to the same assignee. In essence, ampoule 30 is preferably made of quartz and contains therein a polycrystalline mixture of GaAs and a dopant. Per the copending application, although only GaAs and As are discussed herein, it should be appreciated that different types of semiconductor materials and dopants may be used in the present invention furnace, as different melt temperatures and temperature gradients may be easily effected to accommodate the different semiconductor materials.

As shown in FIG. 1A, to fabricate a semiconductor crystal from the polycrystalline material, furnace 2 is moved relative to ampoule 30 by means of nut 36 and screw 38, discussed previously. Assume that furnace 2 is moving in the direction designated by arrow 52 and further assume that the sets of heater elements in zones Z1 through Z5 are powered by their respective processing means to a melt temperature of approximately 1250° C. See FIG. 1B. As ampoule 30 moves through these zones, portion 54 of ampoule 30 penetrates zones Z1 to Z5, the GaAs material contained in this portion, 54L, melts and remains liquified until the beginning of portion 54S reaches the beginning of a slope 56, otherwise referred to as temperature gradient 56. At this juncture, the GaAs material has reached a point whereby the combination of heat generated by the sets of heater elements in zones Z6 to Z8, in combination with the removal of heat from this general area by shunt disc 46, cause the melted material to begin cooling down. By the time that zone 8 reaches portion 54S, it has solidified, reaching its solidification temperature within gradient 56 of approximately 1238° C. At the same time, while the GaAs molten material is traversing through melt zones Z1 through Z5 and the solidification zones, a second temperature gradient designated by slope 58, across zones Z13 to Z18, is provided so that the ampoule in those zones reaches a stable temperature of approximately 600° C., designated by 60 from zones Z18 to Z24. As long as the As element is maintained at this temperature, it provides the proper vapor pressure around the melted GaAs material for forming a stoichiometric mixture prior to the solidification of the same. Thus, since it is perceived that the furnace is operating in a micro-gravity environment, a blemish free and stoichiometrically—perfect semiconductor crystal can be formed in ampoule 30. It should be noted that other locations of liquid and solid heating and cooling zones may be used and combinations with and without furnace motion are feasible for this furnace, in accordance with the type of semiconductor crystal to be grown.

Referring back to FIG. 1A, the shunt discs 50a–50h in zones Z15–Z18 are used to provide a controlled but rapid drop in temperature from level 57 to level 60 in a short axial distance along the furnace, that would otherwise extend the length of the furnace if these shunt discs 50a–50h were not there, effecting greater weight and volume of the furnace. Although there are no heaters shown in zones 15, 16 and 17, these zones could contain heaters which would be controlled off by microprocessor 24 to effect cooling to temperature 60. From zone Z18 on, it should also be quite apparent that power must be applied to the heater elements of zones Z18 to Z24 for maintaining uniform temperature 60. Shunt discs 50h to 50j are used to bring about the beginning of the equilibrium temperature designated by 60.

It must be appreciated that albeit 10 shunt discs 50a to 50j are shown, it could equally be applicable to put in either a greater or lesser number of shunt discs, or greater or lesser number of heated zones Z15 to Z19 provided that these discs and heaters can be shown, either by calculation or empirically, that they are capable of effecting similar temperature gradients. Furthermore, it should be noted that to grow different types of semiconductor crystals, discs having different thickness and distance from muffle 18, as well as situated at different zones within furnace 2, may be used. Furthermore, it should be appreciated that the number of zones shown in FIG. 1A is for illustration purposes only and the number thereof may be increased or decreased, again in accordance to the type of semiconductor crystals to be grown.

Referring now to FIG. 2, there is shown a perspective view of the FIG. 1A furnace. The same components are similarly labeled. As shown therein, furnace jacket 4 actually consists, for this embodiment, of sections 4A and 4B. These sections have corresponding flanges 4AX and 4BX with matching holes for accepting some securing means such as bolts 62. As sections 4A and 4B are clamped together, insulating material, i.e., blocks 28 are pressed firmly onto muffle 18, thereby acting to create a structurally sound furnace. An additional advantage of insulation material 28 lies in its ability to absorb any external vibrations, such as those generated by the launching of the furnace into space, for example, on board the space shuttle.

In summation, the present invention furnace presents an almost ideal directional solidification system for utilization in space as it needs only minimal power to generate the needed temperature and has minimal weight and volume. Moreover, it is structurally sound and can produce temperature gradients for effecting solidification of the semiconductor crystals at very precise locations within the furnace.

Inasmuch as the present invention is subject to many variations, modifications and changes in detail, it is intended that all matters described throughout this specification and shown in the accompanying drawings be interpreted as illustrative only and not in a limiting sense. Accordingly, it is intended that the invention be limited only by the spirit and scope of the appended claims.

We claim:
1. A furnace for growing crystals, comprising:
   a muffle for accepting an ampoule containing a crystal forming material, the muffle movable relative to the ampoule;
   heating means encircling a substantial portion of the muffle for generating heat to melt the crystal material;
   insulating means surrounding the heating means and the muffle for substantially sealing the heat within the muffle so as to substantially reduce the amount of heat needed for heating the same;
   means for confining the insulating means around the muffle to support the muffle and ampoule against external vibrations;
   cooling means in contact relationship with the confining means for providing cooling therealong;
   means for establishing a first temperature gradient to solidify the melted crystal material; and
   means for establishing steep short temperature gradients for providing a controlled but rapid drop in temperature in a short axial distance along the furnace to effect an equilibrium temperature, thereby shortening the length and reducing the weight and volume of the furnace.

2. The furnace according to claim 1, wherein the first temperature gradient establishing means comprises:
   an annular thermal conductive means interposed concentrically between the cooling means and the muffle for establishing an axial temperature gradient in a selected zone of the furnace by providing a radial path for the heat in the zone to flow from the muffle to the cooling means;
   whereby the temperature gradient effects solidification of the melted material at the zone.

3. The furnace according to claim 2, wherein the furnace is divided into a plurality of zones, each zone having its own heating means controlled by a corresponding processing means.

4. The furnace according to claim 1, wherein the steep short temperature gradient establishing means comprises:
   at least one annular thermal conductive means interposed concentrically in a selected zone for establishing an axial temperature gradient for sublimating a second material in the ampoule, the gaseous second material combining with the melted material for forming a stoichiometric correct material prior to solidification thereof.

5. The furnace according to claim 1, wherein the confining means comprises a cylindrical jacket;
   wherein the cooling means comprises a plurality of tubes coupled longitudinally to the jacket for carrying a cooling medium to regulate the temperature of the jacket.

6. The furnace according to claim 4, wherein the annular means comprise shunt discs.

7. In a furnace for growing at least one semiconductor crystal, the furnace having a passage for accepting and supporting an ampoule containing crystal forming materials which include an ingot and dopant material, the furnace movable relative to the ampoule, the furnace comprising:
   a tubular chamber for forming the passage, the ampoule traversing longitudinally in relation to the chamber;
   means encircling the chamber for heating the interior of the chamber and the ampoule, the material melting into a liquid state;
   means surrounding the chamber and the heating means for insulating the chamber so as to substantially eliminate heat loss from the chamber;

a thermal-conductive jacket for encompassing the insulating means firmly about the chamber, thereby providing for a structurally sound furnace;

means coupled to the jacket for regulating the temperature of the jacket;

at least one annular thermal conductive means interposed concentrically between the jacket and the chamber for establishing a steep axial temperature gradient in a selected zone of the furnace to solidify the liquified material and establishing a steep axial temperature gradient between the ingot and dopant material, the annular means providing a radial path for heat to flow from the chamber outward to the jacket.

8. The furnace according to claim 7, further comprising:

thermometric means located proximately to the chamber for sensing the temperature thereat;

processing means for receiving the sensed temperature and for regulating the heating means by supplying power thereto.

9. The furnace according to claim 7, wherein the chamber is a muffle made of alumina.

10. The furnace according to claim 7, wherein the furnace is divided into a plurality of zones, each zone including a separate heating means controlled by a corresponding processing means.

11. The furnace according to claim 7, further comprising:

at least one additional thermal-conductive means positioned axially in a zone different from the selected zone for establishing a second axial temperature gradient for gasifying a second material within the ampoule, the gaseous second material combining with the liquified material to form a stoichiometric correct material for solidification, the second axial temperature gradient further providing a controlled but rapid drop in temperature in a short axial distance, along the furnace for shortening the length of the furnace, to effect an equilibrium temperature; thereby reducing the volume and weight of the same.

12. The furnace according to claim 7, wherein the annular thermal-conductive means comprises a shunt disc.

* * * * *